(12) United States Patent
Bernon-Enjalbert et al.

(10) Patent No.: US 8,438,419 B2
(45) Date of Patent: May 7, 2013

(54) FAULT MANAGEMENT FOR A COMMUNICATION BUS

(75) Inventors: Valerie Bernon-Enjalbert, Fonsorbes (FR); Thierry Cassagnes, Tournefeuille (FR); Philippe Lance, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 312 days.

(21) Appl. No.: 12/997,993

(22) PCT Filed: Jun. 30, 2008

(86) PCT No.: PCT/IB2008/053511
§ 371 (c)(1),
(2), (4) Date: Dec. 14, 2010

(87) PCT Pub. No.: WO2010/001200
PCT Pub. Date: Jan. 7, 2010

(65) Prior Publication Data
US 2011/0093739 A1    Apr. 21, 2011

(51) Int. Cl.
*H04L 29/14* (2006.01)
(52) U.S. Cl.
USPC .......................................... 714/4.5
(58) Field of Classification Search .......... 714/4.5
See application file for complete search history.

(56) References Cited

U.S. PATENT DOCUMENTS

| | | | |
|---|---|---|---|
| 5,357,518 A * | 10/1994 | Peter ............................. | 714/4.5 |
| 5,430,396 A * | 7/1995 | Morano .......................... | 326/90 |
| 5,488,306 A | 1/1996 | Bonaccio | |
| 6,034,995 A | 3/2000 | Eisele et al. | |
| 6,147,967 A | 11/2000 | Ying et al. | |
| 7,012,450 B1 * | 3/2006 | Oner et al. ..................... | 326/86 |
| 7,248,061 B2 * | 7/2007 | Yamamoto et al. ........... | 324/705 |
| 2002/0140433 A1 | 10/2002 | Lawson et al. | |
| 2004/0008624 A1 | 1/2004 | Delong et al. | |
| 2006/0114627 A1 | 6/2006 | Wong | |
| 2006/0158232 A1 * | 7/2006 | Lenz ............................. | 327/112 |
| 2010/0020813 A1 * | 1/2010 | Brekke et al. ................. | 370/402 |

OTHER PUBLICATIONS

International Search Report and Written Opinion correlating to PCT/IB2008/053511 dated Mar. 6, 2009.

* cited by examiner

*Primary Examiner* — Scott Baderman
*Assistant Examiner* — Neil Miles (57) ABSTRACT

A differential communication bus comprising a master module and a plurality of slave modules connected to at least first and second conductors whereby to communicate between the master and slave modules. The master module comprises a driver for applying first and second voltages respectively to the first and second conductors and for sourcing and sinking currents in the first and second conductors. The driver controls a difference between the first and second voltages and a common mode value of the first and second voltages. The driver includes first sourcing and sinking current limiters and second sourcing and sinking current limiters for limiting the currents in the first and second conductors. The master module is selectively responsive to a fault condition triggering simultaneous activation of the first and second sourcing current limiters or of the first and second sinking current limiters to disable the driver.

20 Claims, 5 Drawing Sheets

| HS_SO_lim_F | LS_SO_lim_F | HS_SI_lim_F | LS_SI_lim_F | Double_fault after filtering | Condition during power phase | Disable driver |
|---|---|---|---|---|---|---|
| 0 | 0 | 0 | 0 | 0 | Normal | No |
| 0 | 1 | 0 | 0 | 0 | Slave charging or HS wire shorted to voltage >Vcm | No |
| 0 | 0 | 1 | 0 | 0 | LS wire shorted to ground | No |
| 0 | 0 | 0 | 1 | 0 | HS wire shorted to voltage 2*Vcm | No |
| 1 | 1 | 0 | 0 | 1 | LS wire shorted to voltage <Vcm | No |
| 1 | 1 | 0 | 0 | 1 | HS wire shorted to ground (double fault) | Yes |
| 0 | 0 | 1 | 1 | 1 | LS wire shorted to 2*Vcm (double fault) | Yes |

Fig. 10

FAULT MANAGEMENT FOR A COMMUNICATION BUS

FIELD OF THE INVENTION

This invention relates to fault management for a communication bus and more specifically to response to a fault condition in a communication bus comprising at least one master module and a plurality of slave modules connected by a differential bus.

BACKGROUND OF THE INVENTION

Historically, control and communication networks often relied on cable bundles, in which control or information master modules were connected to remote actuator or sensor slave modules by separate electrical conductors. Such cable bundles have become increasingly complex and inflexible and are now often replaced at least partially by communication busses in automotive and other transport and industrial applications. In such communication busses, command and response signals pass between the master modules and the slave modules over shared conductors, with signal protocols encoding or addressing the signals to ensure that the appropriate destinations and/or origins of the signals are identified.

An example of a communication bus to which the present invention is particularly, but not exclusively, applicable is the Distributed System Interface ('DSI'), which is a 'niche' area network. DSI is a two-conductor serial bus suitable for linking safety-related sensors, actuators and other components with control units, for systems such as air-bags in vehicles, for example. The specification of the DSI standard can be found at the Internet site: http://www.freescale.com/files/analog/doc/support info/dsibusstandard.pdf?fpsp=1&WT TYPE=Su pporting%20Information&WT VENDOR=FREESCALE&WT FILE FORMAT=pdf&WT ASSET=Do cumentation.

Communication busses are susceptible to fault conditions in the conductors, such as short circuit or open circuit conditions. U.S. Pat. Nos. 6,034,995, 6,147,967 and 5,488,306 relate to differential bus and fault detection and describe ways of addressing such faults. However, they do not address some risks of consequential physical damage to components of the busses nor damage limitation in presence of a fault condition.

SUMMARY OF THE INVENTION

The present invention provides a master module and a differential bus system as described in the accompanying claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Figure 1:
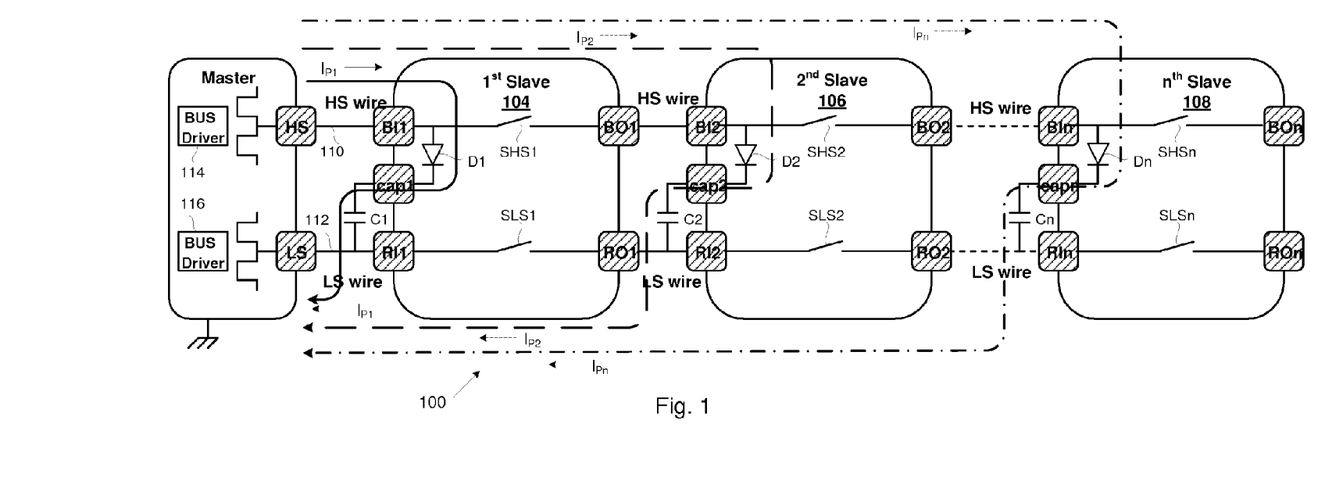
FIG. 1 is a schematic diagram of a DSI bus system with a master module and a plurality of slave modules in accordance with one embodiment of the invention, given by way of example.

FIG. 1 shows the communication elements and components of a bus system 100 which includes a master module 102 and a plurality of slave modules 104, 106 and 108. The bus system shown in FIG. 1 by way of example is compliant with the Distributed System Interface ('DSI') standard version 2.02 published by Freescale Semiconductor, Inc. and TRW Automotive. The DSI bus system shown in FIG. 1 is a two wire differential voltage bus system operating at three differential voltage levels, with common mode voltage control. Slave modules may attach to the bus in daisy chain or parallel connections. In the optional daisy chain connection shown in FIG. 1, the slave modules have programmable addresses, which allows the central module to establish the node addresses at power-up. The parallel configuration may be used for devices that have preprogrammed or fixed addresses.

DSI messages are composed of individual words separated by a frame delay. Transfers are full duplex. Command messages from the master occur at the same time as responses from the slaves. Slave responses to commands occur during the next command message. The bus utilizes voltage mode signaling for messages sent from the master to the slaves and current mode signaling from the slaves to the master. The master may send messages to one or a combination of slaves on the bus. Slaves only transmit in response to messages sent from the master. The number of nodes on the bus is variable but is known a priori for a particular configuration. One or more DSI busses may be used in a system.

It will be appreciated that embodiments of the invention may be applied to other differential communication bus systems.

The master module 102 comprises ports HS and LS connected respectively to a high side wire 110 and to a low side wire 112, the high side port HS being at a more positive voltage than the low side port LS in this embodiment of the invention. Each of slave modules 104 to 108 comprises ports BI and RI connected over the high side wire 110 and the low side wire 112 to the preceding slave module (to the master module in the case of the first slave module 102) and comprise ports BOx and ROx connected over the high side wire 110 and the low side wire 112 to the following slave module (except for the last slave module in the chain).

In an example of an application of the differential communication bus apparatus shown in FIG. 1, the slave modules 104-108 include voltage responsive decoders (not shown) for decoding messages received from the master module over the bus wires 110 and 112, logic regulators (not shown) for activating and controlling responses by the slave modules and a slave current response encoder (not shown) for sending messages over the bus wires 110 and 112 to the master module 102. The master module is connected with a microcontroller unit ('MCU') through a suitable interface (not shown). In an application in an air-bag control system, for example, some of the slave modules 104-108 are connected to accelerometers to signal excessive accelerations through the master module 102 to the MCU, which reacts by sending commands to the slave modules to detonate air-bag actuators to which other slave modules are connected.

Each of the slave modules 104 to 108 also comprises a node capx where x is the position of the module in the chain), a power storage capacitor Cx connected between the node capx and the port Rlx and a diode Dx connected between the port Blx and the node capx in the sense to conduct current from the port Blx to the node cpax and to block current flow in the opposite direction. Each of the programmable slave modules 104 to 108 also comprises bus switches SHSx and SLSx which are selectively closable to connect the ports Blx and Rlx respectively with the ports BOx and ROx. However switches such as SHSx and SLSx would not be necessary in the case of parallel connected pre-programmed slave modules. The master module 102 comprises a driver having a high side element 114 and a low side element 116, both the elements 114 and 116 having current sourcing and current sinking capability with sourcing and sinking current limiters for the sourcing and sinking capabilities of both the high side and low side elements.

Figure 2:
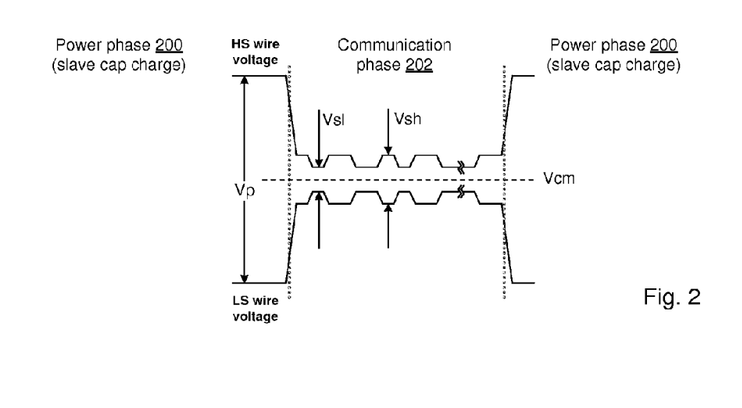
FIG. 2 is a waveform diagram showing the variation with time of signals appearing in the bus system of FIG. 1.

During alternate phases, the master module 102 supplies power to the slave modules 104 to 108 and communicates by signals with the slave modules over the high side and low side conductors 110 and 112 of the bus. As shown in FIG. 2, the bus has three differential voltage levels. During a power phase 200, the capacitors Cx are charged, to provide power autarchy for the slave module, with the master module applying a differential voltage Vp across the high side and low side wires 110 and 112. During a subsequent communication phase 202, the master module applies two signal differential voltages Vsh and Vsl, both smaller than the power phase voltage Vp, across the high side and low side wires 110 and 112, with duty cycle modulation for messages from the master module and with the slave module response encoded by modulation of the current it draws. For all the differential voltage levels, during both the power phase 200 and the communication phase 202, the driver elements 114 and 116 of the master module 102 regulate the common mode voltage value Vc, that is to say the average voltage of the wires 110 and 112, so as to reduce electromagnetic emissions. It has been found that with regulation of the common mode voltage value Vc, and with the same driver elements 114 and 116 for the power phase 200 as for the communication phase 202, a reduction of 20 dB in radio emission has been obtained compared to an otherwise similar master module but without regulation of the common mode voltage value Vc and with separate high side and low side driver elements, different for the power phase 200 than for the communication phase 202, due to switching transients. Also layout matching of the driver elements was simplified.

On power up, an initialization routine is followed and, during the first power phase 200, the master module 102 applies a voltage Vp to the ports Bl1 and Rl1 of the first slave module 104, whose capacitor C1 charges with a current $I_{P1}$, the bus switches SHS1 and SLS1 being open to prevent current flowing to the other slave modules. Once the capacitor C1 of the first slave module 104 is charged (a time lapse of a few tens of milliseconds), in the following communication phase 202, the master modules sends a command to set the programmable address of the slave module 104 and then a command to close its bus switches SHS1 and SLS1. In the next power phase 200, the slave module 104 applies the voltage Vp from the master module 102 to the following slave module 106, whose capacitor C2 charges with a current $I_{P2}$, and the initialization cycle repeats for each slave module in turn until all are charged and their addresses programmed. During subsequent frames, the charges of all the capacitors Cx are topped up during the power phases 200, and messages are sent to specific slave modules identified by their addresses during the communication phases 202.

Figure 3:
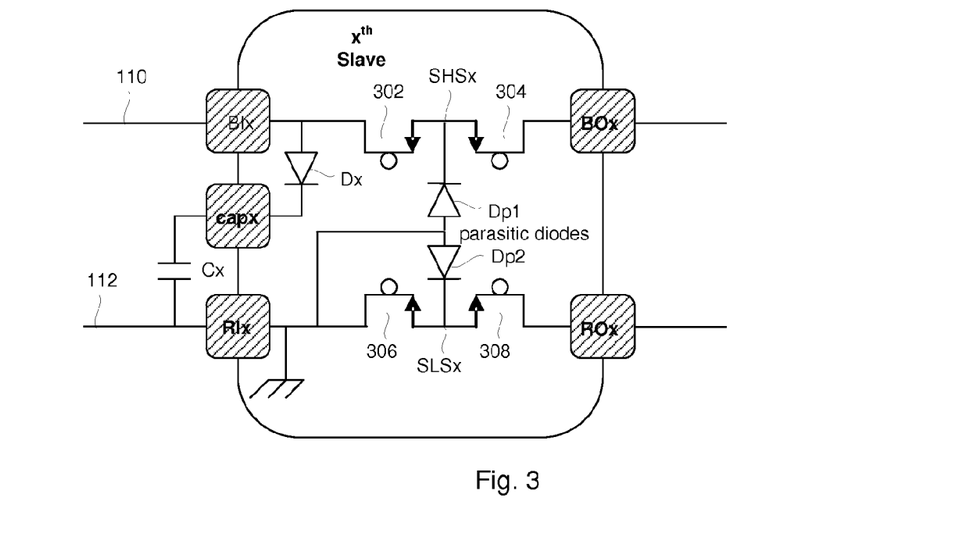
FIG. 3 is a simplified circuit diagram of a slave module in the bus system of FIG. 1.
Figure 4:
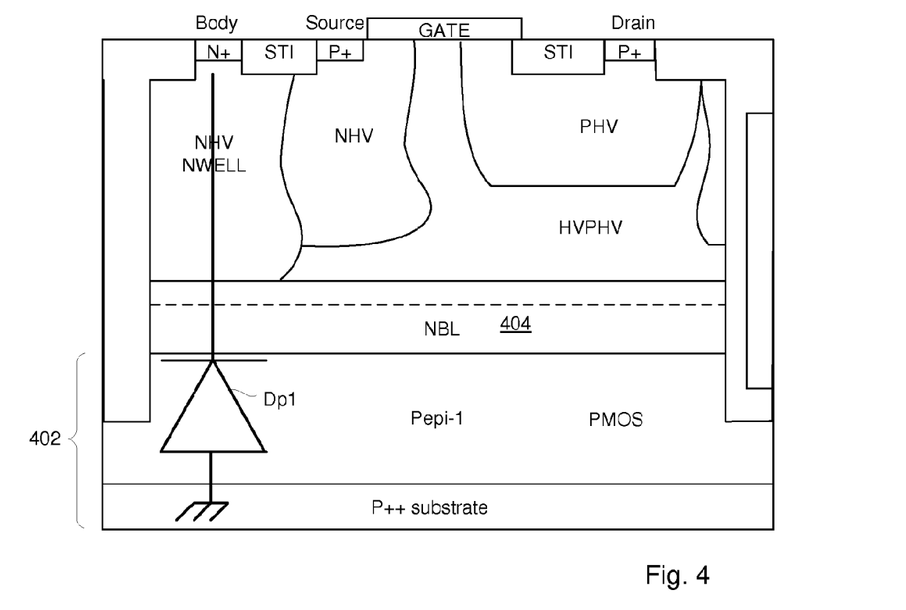
FIG. 4 is a sectional view of an integrated circuit in the slave module of FIG. 3.

The integrated circuits of the slave modules 104 to 108 are each connected with the low side input port RI as virtual ground for its substrate. In the example shown in FIGS. 3 and 4, the bus switches SHSx and SLSx of the $x^{th}$ slave module are each formed by respective pairs 302, 304 and 306, 308 of metal-oxide field-effect transistors ('MOSFETs'), the sources of the MOSFETs of each pair being connected together and the drains being connected to the ports Blx, BOx and Rlx, ROx respectively. However, PN junctions exist in the integrated circuits between the P-type substrate 402 and the N-type isolation layers 404, which normally are reverse biased and therefore normally do not affect the operation of the MOSFETS, but form parasitic diodes Dp1 and DP2 in the bus switches SHSx and SLSx respectively. FIG. 4 shows a simplified section of an example of MOSFET in accordance with this embodiment of the invention, which is a horizontal MOSFET, and shows the P-type source and drain, the gate and the formation of the parasitic diode Dp1 by the PN junction between the P-type substrate layers 402 and the N-type isolation layers 404.

Figure 5:
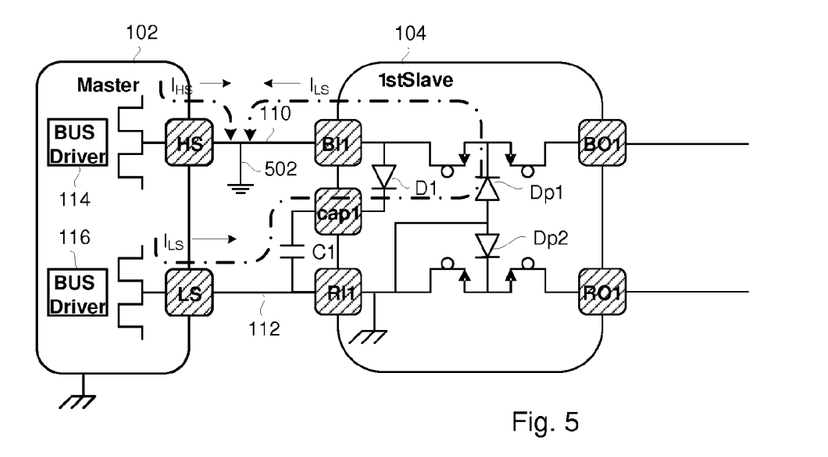
FIG. 5 is a schematic diagram of current flow in a master module and a slave module in the bus system of FIG. 1, during a fault condition.

FIGS. 5 and 6 show the current flows in presence of a fault condition during the power phase 200. In the case shown in FIG. 5, the fault illustrated is a short to ground 502 on the high side wire 110 before the first slave module 104, which causes a current $I_{HS}$ to flow from the high side driver element 114 of the master module to the ground short 502, whose magnitude typically will reach the limit defined by the sourcing current limiter source, 500 mA in this example. The current flow $I_{HS}$ pulls down towards ground the voltage at the high side port HS of the master module. The reduction in the high side voltage at the port HS also reduces the common mode voltage Vc and the low side driver element 116 reacts to attempt to regulate the common mode voltage to its nominal level by increasing the voltage at the low side port LS of the master module. However, this increase in the voltage of the low side ports and wire forward biases the parasitic diode Dp1, which causes a current $I_{LS}$ to flow from the low side driver element 116 of the master module through the slave module 104 and the port Bl1 to the ground short 502, and the magnitude of the current $I_{LS}$ typically will also reach the limit defined by the sourcing current limiter source, 500 mA in this example. This fault therefore produces a double short circuit current in the master module 102 during a period which can be as long as the initialization period (tens of milliseconds), causing excessive power dissipation in the master module, which is liable to damage the master module by overheating.

Figure 6:
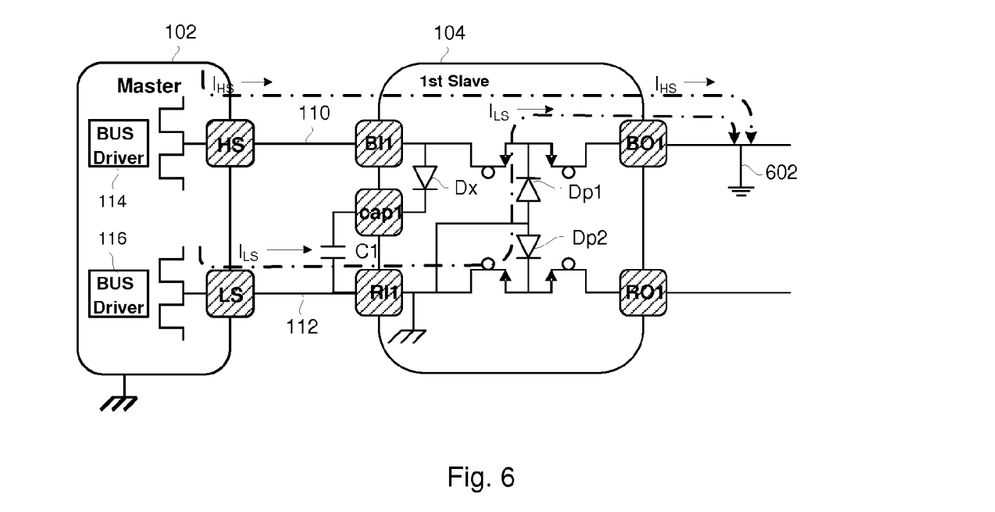
FIG. 6 is a schematic diagram of current flow in a master module and a slave module in the bus system of FIG. 1, during another fault condition.

A similar double short circuit current is produced in the case shown in FIG. 6, where the fault illustrated is a short to ground 602 on the high side wire 110 after the first slave module 104, with the current flow $I_{HS}$ as well as the current flow $I_{LS}$ passing through the slave module 104, which is likely to damage the slave module 104 as well as the master module.

Similar double fault conditions can be produced by a short on the low side wire 112 to battery voltage, the fault currents then flowing through the parasitic diode Dp2 of the low side bus switch SLS1. Fault currents can be produced in more than one slave module if the short condition is further from the master module 102.

In all these cases, both the high side and the low side sourcing current limiters of the master module 102 are activated, or alternatively both the high side and the low side sinking current limiters of the master module 102 are activated.

Figure 7:
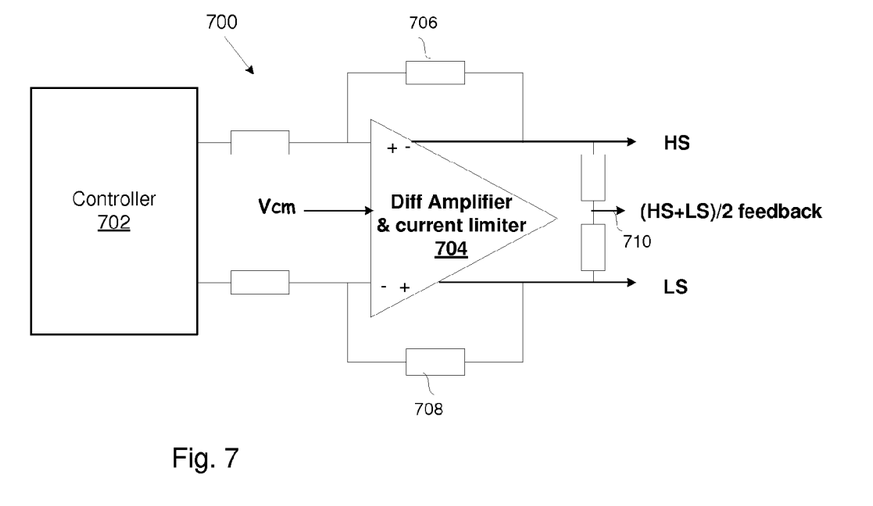
FIG. 7 is a more detailed diagram of a master module in the bus system of FIG. 1.

An example of a voltage generator 700 for the driver elements 114 and 116 of the master module 102 is shown in FIG. 7. The generator 700 comprises a controller 702 which applies input signals defining the desired differential voltages Vp, VSL and VSH and the desired common mode voltage value Vcm to a differential amplifier and current limiter 704. Feedback resistors 706 and 708 provide feedback of the output voltages at the ports HS and LS respectively and a voltage divider 710 provides feedback of the common mode value of the output voltages.

Figure 8:
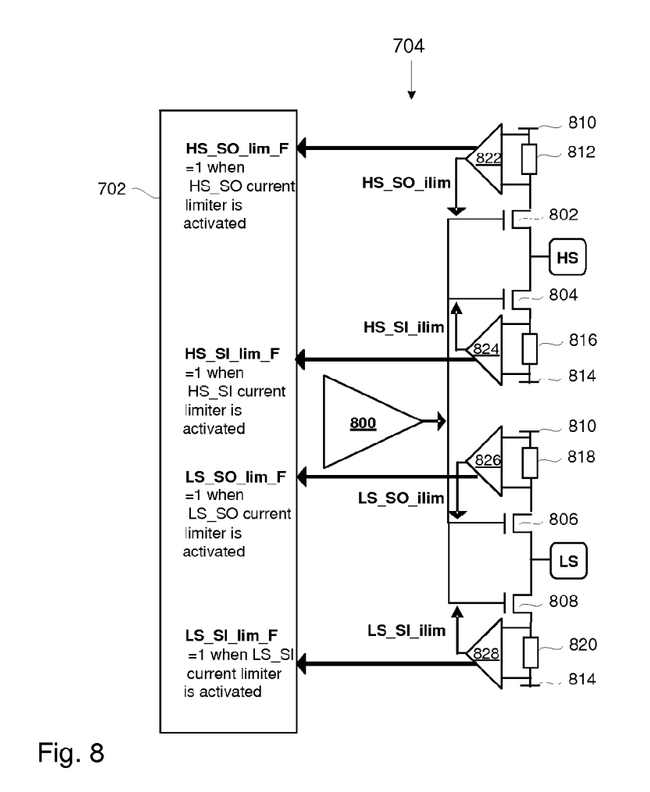
FIG. 8 is a schematic diagram of a differential amplifier and current limiter in the master module of FIG. 7.

FIG. 8 shows the regulation structure of the voltage generator 700 in more detail. The differential amplifier and current limiter 704 comprises a differential amplifier 800 applying reference voltages to control terminals of current control elements 802, 804, 806 and 808, in the form of MOSFETs in this example. The current conduction path of the high side current sourcing MOSFET 802 is connected in series with a current sensing resistor 812 between the more positive power supply terminal 810 and the high side port HS, and the current conduction path of the high side current sinking MOSFET 804 is connected in series with a current sensing resistor 816 between the less positive power supply terminal 814 and the high side port HS. The current conduction path of the low side current sourcing MOSFET 806 is connected in series with a current sensing resistor 818 between the more positive power supply terminal 810 and the low side port LS, and the current conduction path of the low side current sinking MOSFET 808 is connected in series with a current sensing resistor 820 between the less positive power supply terminal 814 and the low side port LS. Buffers 822, 824, 826 and 828 receive the voltage across the current sensing resistors 812, 816, 818 and 820 respectively and if the current tends to exceed a set limit, applies a voltage to the control terminal of the corresponding MOSFET 802, 804, 806 or 808 so as to limit the current in the MOSFET to the set value and asserts a flag signal HS_SO_lim_F, HS_SI_lim_F, LS_SO_lim_F or LS_SI_lim_F at the controller 702.

Figure 9:
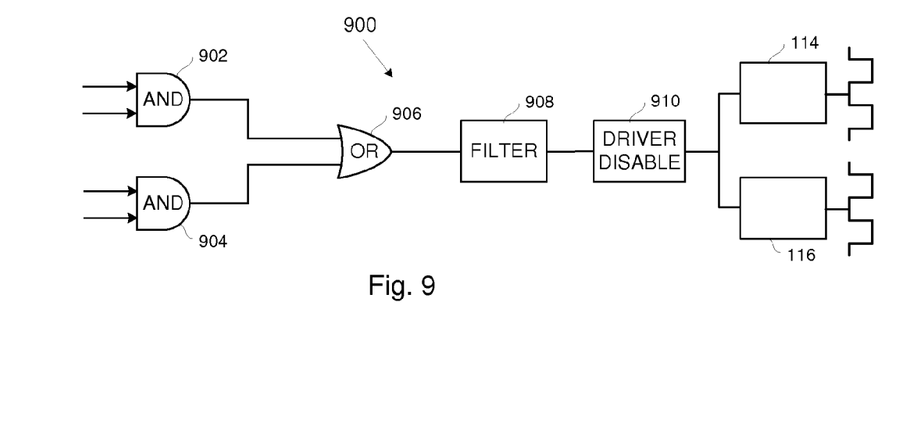
FIG. 9 is a schematic diagram of a controller in the bus system of FIG. 1.

FIG. 9 shows an example of an implementation of a double fault condition detector 900 in the controller 702. The detector 900 comprises an AND gate 902 receiving the flag signals HS_SO_lim_F and LS_SO_lim_F, and an AND gate 904 receiving the signals HS_SI_lim_F and LS_SI_lim_F. The outputs of the AND gates 902 and 904 are connected to the inputs of an OR gate 906. The output of the OR gate 906 is connected through a low pass filter 908 to a circuit 910 which disables both the driver elements 114 and 116 if it receives an input from the filter 908.

Figure 10:
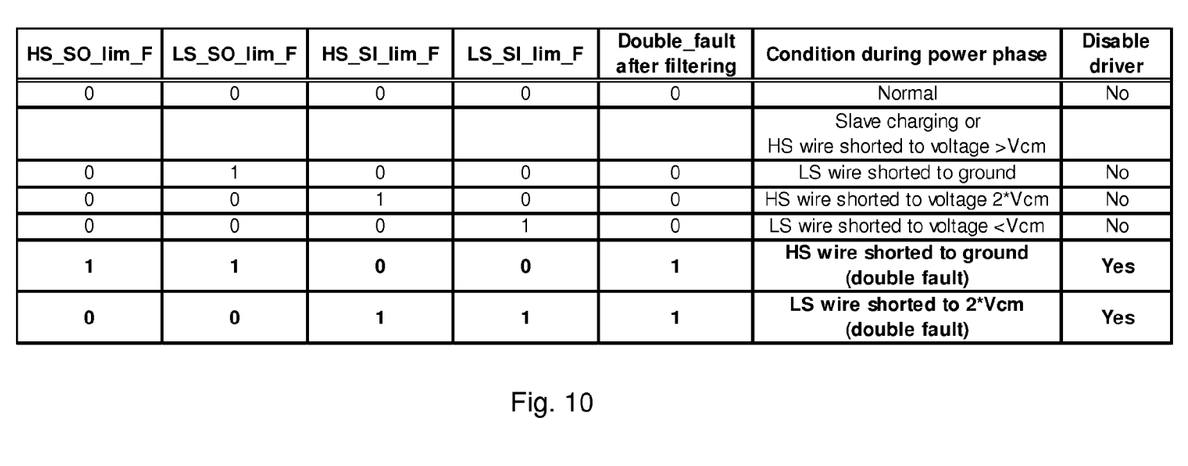
FIG. 10 is a table showing responses of the bus system of FIG. 1 to different operating conditions.

In operation, various flag signal conditions, summarised in the table shown in FIG. 10, give rise to different responses of the controller 702. If no flag signal is asserted, the controller 702 allows normal operation. If only a single flag signal is asserted, the controller 702 this as a normal charging mode (HS_SO_lim_F) or a relatively benign fault condition:
   HS wire 110 shorted to a voltage higher than Vcm (HS_SO_lim_F)
   LS wire 112 shorted to ground (LS_SO_lim_F)
   HS wire. 110 shorted to a voltage twice Vcm (HS_SI_lim_F)
   LS wire 112 shorted to a voltage lower than Vcm (LS_SI_lim_F)

Only if both the high side and the low side sourcing current limiter flag signals HS_SO_lim_F and LS_SO_lim_F are asserted or if both the high side and the low side sinking current limiter flag signals HS_SI_lim_F and LS_SI_lim_F are asserted does the corresponding AND gate 902 or 904 assert its output, causing the OR gate to assert its output in turn and activate the driver disable 910 to halt the supply of current by the driver elements 114 and 116. The low pass filter 908 avoids unnecessary triggering of the driver disable 910 by noise or transients or other glitches.

In this way, the master module 102 is selectively responsive to a fault condition triggering simultaneous activation of the high side and low side sourcing current limiters or of the high side and low side sinking current limiters to generate a specific fault signal. In this example, the response to a fault triggering simultaneous activation of the high side and low side sourcing current limiters or of the high side and low side sinking current limiters is to disable the driver, which reduces the time during which a double fault current can flow to an interval much shorter than the power phase period 202.

The methods of embodiments of the invention may also be implemented partially or wholly in a computer program including code portions for performing steps of the method when run on a programmable apparatus, such as a computer system, or enabling a programmable apparatus to perform functions of a device or system according to embodiments of the invention. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system. The computer program may be provided on a data carrier, such as a CD-ROM or other storage device, containing data loadable in a memory of a computer system, the data representing the computer program. The data carrier may further be a data connection, such as a telephone cable or a wireless connection. The description of the information processing architecture has been simplified for purposes of illustration, and it is just one of many different types of appropriate architectures that may be used in embodiments of the invention. It will be appreciated that the boundaries between logic blocks are merely illustrative and that alternative embodiments may merge logic blocks or circuit elements or impose an alternate decomposition of functionality upon various logic blocks or circuit elements.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

Where the context admits, it will be understood that the semiconductor substrate described herein can be any semiconductor material or combinations of materials, such as gallium arsenide, silicon germanium, silicon-on-insulator (SOI), silicon, monocrystalline silicon, the like, and combinations of the above.

As used herein, the term "bus" is used to refer to a plurality of signals or conductors which may be used to transfer signals or power. The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Where the apparatus implementing the present invention is composed of electronic components and circuits known to those skilled in the art, circuit details have not been explained to any greater extent than that considered necessary for the understanding and appreciation of the underlying concepts of the present invention.

Where the context admits, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Where the context admits, illustrated hardware elements may be circuitry located on a single integrated circuit or within a same device or may include a plurality of separate integrated circuits or separate devices interconnected with each other. Also, hardware elements in an embodiment of the invention may be replaced by software or code representations in an embodiment of the invention.

Furthermore, it will be appreciated that boundaries described and shown between the functionality of circuit elements and/or operations in an embodiment of the invention are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

In the claims, any reference signs placed between parentheses shall not be construed as limiting the claim. Where the context admits, terms such as "first" and "second" are used to distinguish arbitrarily between the elements such terms describe and these terms are not necessarily intended to indicate temporal or other prioritization of such elements.

The invention claimed is:

1. A master module for a differential communication bus, the bus comprising at least first and second conductors whereby to communicate between the master module and a plurality of slave modules connected to the conductors of the bus, the master module comprising:
a driver for applying first and second voltages respectively to said first and second conductors and for sourcing and sinking currents in said first and second conductors, said driver controlling a difference between said first and second voltages and a common mode value of said first and second voltages, said driver including first sourcing and sinking current limiters and second sourcing and sinking current limiters for limiting said currents in said first and second conductors respectively;
wherein said master module is selectively responsive to a fault condition triggering simultaneous activation of said first and second sourcing current limiters or of said first and second sinking current limiters to generate a specific fault signal.

2. A master module as claimed in claim 1, responsive to a fault condition triggering simultaneous activation of said first and second sourcing current limiters or of said first and second sinking current limiters to disable said driver.

3. A master module as claimed in claim 2, comprising a controller responsive to limiter flag signals representative of activation of said current limiters for disabling said driver, said limiter flag signals being filtered to remove noise and/or transients.

4. A master module as claimed in claim 1, wherein said driver is arranged during alternate periods to supply power to said slave modules and to communicate signals with said slave modules over said first and second conductors of the bus.

5. A master module as claimed in claim 1, which is compliant with the Distributed Interface System bus standard.

6. A master module as claimed in claim 5, which is compliant with version 2.02 of the Distributed Interface System bus standard.

7. A differential communication bus apparatus including a master module as claimed in claim 1, said bus and said slave modules, said first and second conductors being connected to said master module and to said slave modules.

8. A differential communication bus apparatus as claimed in claim 7, wherein said slave modules each include a semiconductor circuit having a substrate connected with one of said first and second conductors and said semiconductor circuit presenting at least one parasitic diode.

9. A differential communication bus as claimed in claim 7, wherein said slave modules each include a capacitance for storing power supplied by said master module over said first and second conductors.

10. A master module as claimed in claim 2, wherein said driver is arranged during alternate periods to supply power to said slave modules and to communicate signals with said slave modules over said first and second conductors of the bus.

11. A master module as claimed in claim 3, wherein said driver is arranged during alternate periods to supply power to said slave modules and to communicate signals with said slave modules over said first and second conductors of the bus.

12. A master module as claimed in claim 2, which is compliant with the Distributed Interface System bus standard.

13. A master module as claimed in claim 3, which is compliant with the Distributed Interface System bus standard.

14. A master module as claimed in claim 4, which is compliant with the Distributed Interface System bus standard.

15. A differential communication bus apparatus including a master module as claimed in claim 6, said bus and said slave modules, said first and second conductors being connected to said master module and to said slave modules.

16. A differential communication bus apparatus including a master module as claimed in claim 2, said bus and said slave modules, said first and second conductors being connected to said master module and to said slave modules.

17. A differential communication bus apparatus including a master module as claimed in claim 3, said bus and said slave modules, said first and second conductors being connected to said master module and to said slave modules.

18. A differential communication bus apparatus including a master module as claimed in claim 4, said bus and said slave modules, said first and second conductors being connected to said master module and to said slave modules.

19. A differential communication bus apparatus including a master module as claimed in claim 5, said bus and said slave modules, said first and second conductors being connected to said master module and to said slave modules.

20. A differential communication bus as claimed in claim 8, wherein said slave modules each include a capacitance for storing power supplied by said master module over said first and second conductors.

* * * * *